(12) United States Patent
Park

(10) Patent No.: US 8,872,357 B2
(45) Date of Patent: Oct. 28, 2014

(54) ANISOTROPIC CONDUCTIVE FILM COMPOSITION AND SEMICONDUCTOR DEVICE BONDED BY THE SAME

(71) Applicant: Do Hyun Park, Uiwang-si (KR)

(72) Inventor: Do Hyun Park, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/670,569

(22) Filed: Nov. 7, 2012

(65) Prior Publication Data

US 2013/0119563 A1    May 16, 2013

(30) Foreign Application Priority Data

Nov. 14, 2011   (KR) ........................ 10-2011-0118240

(51) Int. Cl.
| H01B 1/12 | (2006.01) |
| C08G 18/06 | (2006.01) |
| H01L 23/28 | (2006.01) |
| C09J 175/16 | (2006.01) |
| H01L 23/00 | (2006.01) |
| C09J 9/02 | (2006.01) |

(52) U.S. Cl.
CPC ............. *H01L 24/29* (2013.01); *C09J 175/16* (2013.01); *C09J 9/02* (2013.01); *H01L 2224/83101* (2013.01); *H01L 2224/32225* (2013.01); *H01L 24/32* (2013.01); *H01L 2224/2929* (2013.01); *H01L 2924/07811* (2013.01)
USPC ....... 257/787; 252/500; 528/75; 257/E23.116

(58) Field of Classification Search
None
See application file for complete search history.

(56) References Cited

U.S. PATENT DOCUMENTS

| 2010/0148130 A1* | 6/2010 | Namkung et al. ............ 252/513 |
| 2011/0133130 A1* | 6/2011 | Kim et al. .................... 252/500 |
| 2013/0113119 A1* | 5/2013 | Namkung et al. ............ 257/783 |

FOREIGN PATENT DOCUMENTS

| KR | 10-2010-0060173 A | 6/2010 |
| KR | 10-2010-0067559 A | 6/2010 |

* cited by examiner

*Primary Examiner* — Ling Choi
*Assistant Examiner* — Catherine S Branch
(74) *Attorney, Agent, or Firm* — Lee & Morse, P.C.

(57) ABSTRACT

An anisotropic conductive film composition for bonding a semiconductor device, the composition including: a binder system including a urethane resin having a glass transition temperature of about 100° C. or higher, a radical polymerizable compound, an organic peroxide, and conductive particles.

15 Claims, No Drawings

ANISOTROPIC CONDUCTIVE FILM COMPOSITION AND SEMICONDUCTOR DEVICE BONDED BY THE SAME

BACKGROUND

1. Field

Embodiments relate to an anisotropic conductive film composition and a semiconductor device bonded by the anisotropic conductive film composition.

2. Description of the Related Art

Adhesives may be used in semiconductor devices to bond different elements, and the bonded surfaces of these elements may include irregular features. Such adhesives should have suitable electrical properties depending on the elements being bonded. Such adhesives should also have suitable adhesive properties after being bonded to the elements.

SUMMARY

Embodiments are directed to an anisotropic conductive film composition for bonding a semiconductor device, the composition including: a binder system including a urethane resin having a glass transition temperature of about 100° C. or higher, a radical polymerizable compound, an organic peroxide, and conductive particles.

The urethane resin may have a weight average molecular weight of about 50,000 to about 200,000 g/mol.

The urethane resin may be a polyurethane acrylate resin.

The polyurethane acrylate resin may be prepared by polymerization of: an isocyanate, an acrylate, and a polyol or a diol.

The urethane resin may be present in an amount of about 35 to about 80 parts by weight, based on 100 parts by weight of the solid content of the anisotropic conductive film composition.

The anisotropic conductive film composition may include: about 50 to about 90 parts by weight of the binder system, about 5 to about 40 parts by weight of the radical polymerizable compound, about 0.1 to about 10 parts by weight of the organic peroxide, and about 0.1 to about 10 parts by weight of the conductive particles, all parts being based on 100 parts by weight of the solid content of the anisotropic conductive film composition.

The binder system may further include at least one of a thermoplastic resin and an acrylic copolymer.

Embodiments are also directed to a semiconductor device, including: a substrate including electrodes and a space between the electrodes, and an anisotropic conductive film on the substrate in the space between the electrodes, the anisotropic conductive film including a urethane resin and having: an average bubble area of 10% or less based on an area of the space between the electrodes, and an adhesive strength of about 800 gf/cm or more.

The urethane resin may have a glass transition temperature of about 100° C. or higher.

The urethane resin may be a polyurethane acrylate resin.

The urethane resin may be present in an amount of about 35 to about 80 parts by weight, based on 100 parts by weight of the solid content of the anisotropic conductive film.

The average bubble area and the adhesive strength of the anisotropic conductive film may be measured after pressing the anisotropic conductive film into the space between the electrodes at a temperature of at least about 60° C., a pressure of at least about 1.0 MPa, and for a period of time of at least about 1 second.

The average bubble area and the adhesive strength of the anisotropic conductive film may be measured after pressing the anisotropic conductive film into the space between the electrodes at a temperature of about 200° C., a pressure of about 3.0 MPa, and for a period of time of about 5 seconds.

Embodiments are also directed to an anisotropic conductive film for bonding a semiconductor device, the anisotropic conductive film including a urethane resin and having: an average bubble area of 10% or less when the anisotropic conductive film is pressed in spaces between electrodes on a substrate at a temperature of 200° C., a pressure of 3.0 MPa, and for a period of time of 5 seconds, the average bubble area being an average area of bubbles based on an area of the spaces, and an adhesive strength of about 800 gf/cm or more when the anisotropic conductive film is pressed in spaces between electrodes on a substrate at a temperature of 150° C., a pressure of 3.0 MPa, and for a period of time of 5 seconds.

The urethane resin may have a glass transition temperature of about 100° C. or higher.

The urethane resin may be a polyurethane acrylate resin.

The polyurethane acrylate resin may be present in an amount of about 35 to about 80 parts by weight, based on 100 parts by weight of the solid content of the anisotropic conductive film.

DETAILED DESCRIPTION

Korean Patent Application No. 10-2011-0118240 filed on Nov. 14, 2011, in the Korean Intellectual Property Office, and entitled: "Anisotropic Conductive Film and Semiconductor Device," is incorporated by reference herein in its entirety.

Exemplary embodiments of the present invention will now be described in detail. Details apparent to those skilled in the art may be omitted herein. As used herein, the indefinite article "a", "an", and derivations thereof do not exclude a plurality. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

As used herein, the term "and/or" includes any and all combinations of one or more of the associated listed items. Expressions such as "at least one of," when preceding a list of elements, modify the entire list of elements and do not modify the individual elements of the list.

Unless specified otherwise, the processing order of a process should not be limited by the order in which the process is described. For example, two processes that are described successively may be performed substantially simultaneously, and may be performed in an opposite order to the description.

According to an embodiment, a semiconductor device may be bonded by an anisotropic conductive film composition which may include:

a binder system including a urethane resin having a glass transition temperature (Tg) of about 100° C. or higher;

a radical polymerizable compound;

an organic peroxide; and conductive particles.

The urethane resin may be, e.g., a polyurethane acrylate. The polyurethane acrylate may be prepared by polymerization of an isocyanate, an acrylate, and a compound having more than one hydroxyl group (e.g., a polyol and/or a diol).

The isocyanate may include at least one aromatic, aliphatic, or alicyclic diisocyanate. Examples of such isocyanates may include tetramethylene-1,4-diisocyanate, hexamethylene-1,6-diisocyanate, cyclohexylene-1,4-diisocyanate, methylene bis(4-cyclohexyl isocyanate), isophorone diisocyanate, and 4,4-methylene bis(cyclohexyl diisocyanate). Preferably, aromatic isocyanates may be used.

The acrylate that is polymerized in order to prepare the polyurethane acrylate may include, e.g., hydroxyl acrylates and amine acrylates.

The polyol may include a compound having at least two hydroxyl groups in a molecular chain thereof, e.g., a polyester polyol, a polyether polyol and a polycarbonate polyol. Examples of the polyether polyol may include polyethylene glycol, polypropylene glycol, and polytetraethylene glycol. The polyol may be obtained through condensation of a dicarboxylic acid compound and a diol compound.

Examples of the dicarboxylic acid compound may include succinic acid, glutaric acid, isophthalic acid, adipic acid, suberic acid, azelaic acid, sebacic acid, dodecanedicarboxylic acid, hexahydrophthalic acid, terephthalic acid, orthophthalic acid, tetrachlorophthalic acid, 1,5-naphthalenedicarboxylic acid, fumaric acid, maleic acid, itaconic acid, citraconic acid, mesaconic acid, and tetrahydrophthalic acid.

Examples of the diol compound may include ethylene glycol, propylene glycol, 1,3-propanediol, 1,3-butanediol, 1,4-butanediol, 1,5-pentanediol, 1,6-hexanediol, neopentyl glycol, diethylene glycol, dipropylene glycol, triethylene glycol, tetraethylene glycol, dibutylene glycol, 2-methyl-1,3-pentanediol, 2,2,4-trimethyl-1,3-pentanediol, and 1,4-cyclohexanedimethanol. Diols may be condensed with a dicarboxylic acid compound to produce the above-described polyols, and/or diols may be used as the compound having more than one hydroxyl group in the preparation of the polyurethane acrylate without being condensed with a dicarboxylic acid compound.

The polymerization to produce the polyurethane acrylate may be carried out by a suitable method. For example, methyl ethyl ketone may be used as a solvent at 50% by volume (vol %), the amount of a polyol may be 60% by weight, the amount of isocyanate and acrylate may be 40% by weight, a molar ratio of acrylate to isocyanate may be 1.0, and the reaction may be conducted at 90° C. and 1 atm for 5 hours using a suitable catalyst, e.g., dibutyltin dilaurylate. The polyol and/or diol may be reacted with the isocyanate to form a prepolymer before being reacted with the acrylate.

The urethane resin may have a weight average molecular weight of about 50,000 to about 200,000 g/mol. If the weight average molecular weight of the urethane resin is within this range, the film may exhibit sufficient hardness, the urethane may be easier to synthesize, and the adhesion of the film may be improved.

The urethane resin may be present in an amount of about 35 to about 80 parts by weight based on 100 parts by weight of the solid content of the anisotropic conductive film composition, preferably about 40 to about 80 parts by weight. If the amount of the urethane resin is within this range, the film may exhibit sufficient adhesion, and flowability may be improved, which may make it easier to maintain stable connection. The binder system may further include at least one of a thermoplastic resin and an acrylic copolymer.

The thermoplastic resin may include at least one of acrylonitrile, phenoxy, butadiene, acrylic, polyurethane, urethane acrylate, polyamide, olefin, silicone, and nitrile butadiene rubber (NBR) monomers.

The thermoplastic resin may have a weight average molecular weight of about 1,000 to about 1,000,000 g/mol. Within this range, film strength may be improved, phase separation may be reduced, and deterioration of adhesion may be reduced (e.g., by increasing tack to an adherend).

The thermoplastic resin may be present in an amount of 0 to about 40 parts by weight based on 100 parts by weight of the solid content of the anisotropic conductive film composition, preferably about 5 to about 30 parts by weight. If the amount of the thermoplastic resin is within this range, the dispersion of conductive particles may be improved and deterioration of flowability may be reduced, which may make it easier to maintain stable connection.

The acrylic copolymer may include acrylic copolymers obtained by polymerization of acrylic monomers. For example, the acrylic copolymer may include ethyl acrylates, methyl acrylates, propyl acrylates, butyl acrylates, hexyl acrylates, oxyl acrylates, lauryl acrylates, methacrylates, and modified acrylates thereof, acrylic acids, methacrylic acids, methyl methacrylates, vinyl acetates, and modified acrylic monomers thereof.

The acrylic copolymer may be present in an amount of 0 to about 40 parts by weight based on 100 parts by weight of the solid content of the anisotropic conductive film composition, preferably about 5 to about 30 parts by weight. If the amount of the acrylic copolymer is within this range, the film may be substantially prevented from having soft properties (which may cause the film to exhibit poor reworkability after preliminary pressing in a pressing process), and the film may have improved strength and tack, which may reduce separation in preliminary pressing. The radical polymerizable compound may be a suitable radical polymerizable compound. For example, the radical polymerizable compound may include at least one of acrylates, methacrylates, and maleimide compounds, which may be used as monomers, oligomers, or a combination of monomers and oligomers.

Examples of the acrylates or methacrylates may include methyl acrylate, ethyl acrylate, isopropyl acrylate, isobutyl acrylate, ethylene glycol diacrylate, diethylene glycol diacrylate, trimethylol propane triacrylate, tetramethylol methane tetraacrylate, 2-hydroxy-1,3-diacryloxypropane, 2,2-bis[4-(acryloxypolymethoxy)phenyl]propane, 2,2-bis[4-(acryloxypolyethoxy)phenyl]propane, dicyclopentenyl acrylate, tricyclodecanyl acrylate, and tris(acryloyloxyethyl)isocyanurate.

Examples of the maleimide compounds may include at least one compound containing at least two maleimide groups, for example, 1-methyl-2,4-bis maleimide benzene, N,N'-m-phenylene bis maleimide, N,N'-p-phenylene bis maleimide, N,N'-m-tolylene bis maleimide, N,N'-4,4-biphenylene bis maleimide, N,N'-4,4-(3,3'-dimethylbiphenylene) bis maleimide, N,N'-4,4-(3,3'-dimethyldiphenylmethane)bis maleimide, N,N'-4,4-(3,3'-diethyldiphenylmethane)bis maleimide, N,N'-4,4-diphenylmethane bis maleimide, N,N'-4,4-diphenylpropane bis maleimide, N,N'-4,4-diphenyl ether bis maleimide, N,N'-3,3'-diphenylsulfone bis maleimide, 2,2-bis[4-(4-maleimidephenoxy)phenyl]propane, 2,2-bis[3-s-butyl-4-(4-maleimidephenoxy)phenyl]propane, 1,1-bis[4-(4-maleimidephenoxy)phenyl]decane, 4,4'-cyclohexylidenebis[1-(4-maleimidephenoxy)-2-cyclohexyl]benzene, and 2,2-bis[4-(4-maleimidephenoxy)phenyl]hexafluoropropane.

The radical polymerizable compound may be present in an amount of about 5 to about 40 parts by weight based on 100 parts by weight of the solid content of the anisotropic conductive film composition. If the amount of the radical polymerizable compound is within this range, reliability and overall flowability may improve (i.e., curing density after final pressing may increase). As a result, insufficient contact between conductive particles and a circuit substrate may be prevented at the time of bonding, and connection resistance may decrease, thereby increasing connection reliability. If the amount of the radical polymerizable compound is within this range, it may also be easier to foult the anisotropic conductive film, and adhesive properties may be improved. The organic peroxide used in the present invention may be a polymerization initiator, which may serve as a curing agent that generates free radicals upon heating or exposure to light.

Examples of the organic peroxide may include at least one of, t-butylperoxylaurate, 1,1,3,3-tetramethylbutyl peroxy-2-ethylhexanonate, 2,5-dimethyl-2,5-di(2-ethylhexanoyl peroxy)hexane, 1-cyclohexyl-1-methylethyl peroxy-2-ethylhexanonate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, t-butyl peroxyacetate, dicumyl peroxide, 2,5-dimethyl-2,5-di(t-butylperoxy)hexane, t-butylcumylperoxide, t-hexyl peroxyneodecanoate, t-hexylperoxy-2-ethylhexanonate, t-butylperoxy-2-2-ethylhexanonate, t-butylperoxyisobutylate, 1,1-bis(t-butylperoxy) cyclohexane, t-hexyl peroxyisopropylmonocarbonate, t-butylperoxy-3,5,5-trimethylhexanonate, t-butylperoxypivalate, cumylperoxy-neodecanoate, diisopropylbenzenehydroperoxide, cumene hydroperoxide, isobutylperoxide, 2,4-dichlorobenzoylperoxide, 3,5,5-trimethylhexanoylperoxide, octanoylperoxide, lauroylperoxide, stearoylperoxide, succinic peroxide, benzoylperoxide, 3,5,5-trimethylhexanoylperoxide, benzoylperoxytoluene, 1,1,3,3-tetramethylbutylperoxyneodecanoate, 1-cyclohexyl-1 -methylethylperoxyneodecanoate, di-n-propylperoxydicarbonate, diiso-propylperoxycarbonate, bis (4-t-butylcyclohexyl) peroxydicarbonate, di-2-ethoxymethoxyperoxydicarbonate, di(2-ethylhexylperoxy) dicarbonate, dimethoxy-butylperoxydicarbonate, di(3-methyl-3-methoxybutylperoxy)dicarbonate, 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, 2,2-bis(t-butylperoxy)decane, t-butyltrimethylsilylperoxide, bis(t-butyl)dimethylsilylperoxide, t-butyltriallylsilylperoxide, bis(t-butyl)diallylsilylperoxide, and tris(t-butyl)arylsilylperoxide.

The organic peroxide may be present in an amount of about 0.1 to about 10 parts by weight based on 100 parts by weight of the solid content of anisotropic conductive film composition. If the amount of the organic peroxide is within this range, deterioration in physical properties after final pressing (which may be caused by a retarded curing reaction), may be prevented. Also, if the amount of the organic peroxide is within this range, brittleness of the anisotropic conductive film after curing may decrease, which may make it easier to achieve complete removal of the anisotropic conductive film during reworking.

The conductive particles may include a suitable particle, for example, metal particles (e.g., Au, Ag, Ni, Cu and solder particles), carbon particles, metal-coated resin particles (e.g., particles of polyethylene, polypropylene, polyester, polystyrene, polyvinyl alcohol and modified resins thereof coated with Au, Ag or Ni), and insulating-treated conductive particles further coated with insulating particles.

The particle size of the conductive particles may be within a range of, e.g., about 2 to about 30 μm, and the particle size may be selected depending on the pitch of circuits to be used.

The conductive particles may be present in an amount of about 0.1 to about 10 parts by weight based on 100 parts by weight of the solid content of the anisotropic conductive film composition. If the amount of the conductive particles is within this range, defective connection may be reduced (defective connection may be caused by a decrease in area for connection when terminals are misaligned during connection), and insulation failure may be reduced.

In an embodiment, a semiconductor device may include a substrate that includes electrodes and a space between the electrodes, and the anisotropic conductive film may be in the space between the electrodes. The anisotropic conductive film may include a urethane resin, and may have an average bubble area of 10% or less in the space between the electrodes, and an adhesive strength of 800 gf/cm or more.

The spaces between the electrodes of the semiconductor device may be, e.g., gaps between the electrodes in a printed circuit board (PCB), which may be filled with an anisotropic conductive film composition during pressing.

The area of the spaces between the electrodes may be a suitable area. For example, the area of the space may be as follows: there may be 3 or 4 chip on films (COFs) in a single PCB, and each COF may be provided with about 100 electrodes. The area of spaces between electrodes may be about 250 pitches in width and about 3 mm in length. The area of bubbles generated in the spaces between the about 100 electrodes may be calculated on average, thereby obtaining the average bubble area of the anisotropic conductive film.

The anisotropic conductive film according to the present invention may have an average bubble area of 10% or less based on the area in the space between the electrodes. The average bubble are may be calculated after pressing the anisotropic conductive film at, e.g., 200° C. and 3.0 mMPa for 5 seconds. If the bubble area is within this range, adhesive strength of the film may increase, and process defects and deterioration in bonding reliability may be reduced.

Adhesive strength may be measured at 50 mm/min by a 90° peel strength tester (H5KT, Tinius Olsen). The adhesive strength may be measured after pressing the anisotropic conductive film in the space between the electrodes, e.g., at 150° C. and 3.0 MPa for 5 seconds.

The anisotropic conductive film may have an adhesive strength of 800 gf/cm or more. If the anisotropic conductive film has an adhesive strength within this range, adhesion between terminals of a circuit employing the film may be strengthened, and defective connection and bonding may be reduced.

According to an embodiment, a semiconductor device may include: a wiring substrate, an anisotropic conductive film on a first side of the wiring substrate (which may be the side on which a chip is meant to be mounted), and a semiconductor chip on the anisotropic conductive film, where the anisotropic conductive film may include urethane resin having a glass transition temperature of about 100° C. or higher. The anisotropic conductive film may be between the semiconductor chip and the first side of the wiring substrate, and the anisotropic conductive film may be directly bonded to the semiconductor chip and/or the first side of the wiring substrate.

The wiring substrate and the semiconductor chip may be a suitable wiring substrate and semiconductor chip. For example, the wiring substrate may be a PCB and the semiconductor chip may be a COF.

A method of manufacturing a semiconductor device may be a suitable method.

The glass transition temperature (Tg) may be measured by a suitable method. For example, the glass transition temperature may be measured as follows: the resin to be measured may be converted to a solid state by evaporation of a solvent, and the Tg may be measured by using a thermal mechanical analyzer (TMA, TA Instruments) while elevating temperature from, e.g., −40 to 200° C. at 10° C./min.

The anisotropic conductive film may be obtained by a suitable method. For example, the anisotropic conductive film may be obtained by dissolving and/or liquefying a binder resin in an organic solvent, adding other components thereto, and stirring the solution for a suitable period of time to obtain the anisotropic conductive film composition. The anisotropic conductive film composition may then be applied to a release film at a thickness of about 10 to about 50 μm, and the solution may be dried to volatilize the organic solvent.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Example 1

Preparation of Anisotropic Conductive Film Including a Urethane Resin Having a Tg of About 100° C. or Higher (1) Preparation of Anisotropic Conductive Film Composition An anisotropic conductive film composition was prepared using the following materials:

as a binder system, 40 parts by weight of polyurethane acrylate having a weight average molecular weight of 100,000 g/mol and a Tg of 110° C.; 20 parts by weight of an acrylonitrile butadiene copolymer (1072CGX, Zeon Chemical) dissolved at 25 vol % in toluene/methyl ethyl ketone; and 20 parts by weight of an acrylic copolymer having a weight average molecular weight of 100,000 g/mol (AOF7003, Aekyung Chemical) dissolved at 45 vol % in toluene/methyl ethyl ketone, was used. The polyurethane acrylate was synthesized from 60 wt % of polyol, 39 wt % of aromatic isocyanate, and 1 wt % of hydroxy (meth)acrylate using 50 vol % methyl ethyl ketone as a solvent. First, the polyol and the aromatic isocyanate were reacted to synthesize a prepolymer having an aromatic isocyanate terminal. Then, the prepolymer having the aromatic isocyanate terminal and the hydroxy (meth)acrylate were reacted to prepare the polyurethane acrylate resin. The molar ratio of hydroxy (meth)acrylate to prepolymer having an aromatic isocyanate iinal was 1.0, and polymerization of the polyurethane acrylate resin was carried out at 90° C. and 1 atm for 5 hours using dibutyltin dilaurate as a catalyst.

as a radical polymerizable compound, 15 parts by weight of an acrylate monomer (4-HBA, OSAKA) was used;

as an organic peroxide, 2 parts by weight of benzoyl peroxide (Hansol Chemical) was used; and as conductive particles, 3 parts by weight of conductive Ni particles having a particle size of 5 μm were used;

based on 100 parts by weight of the solid content of the anisotropic conductive film.

(2) Preparation of Anisotropic Conductive Film

The combination prepared above was stirred at a rate such that the conductive particles were not pulverized, and at room temperature (25° C.) for 60 minutes. The combination was formed using a casting knife into a 35 μm thick anisotropic conductive film on a polyethylene base film that had been subjected to silicone release surface treatment. The anisotropic conductive film was dried at 60° C. for 5 minutes.

Example 2

Preparation of Anisotropic Conductive Film Including Urethane Resin Having a Tg of About 100° C. or Higher An anisotropic conductive film was prepared according to the same procedure as in Example 1, except that 50 parts by weight of a polyurethane acrylate having a weight average molecular weight of 100,000 g/mol and a Tg of 110° C.; 15 parts by weight of an acrylonitrile butadiene copolymer (1072CGX, Zeon Chemical) dissolved at 25 vol % in toluene/methyl ethyl ketone; and 15 parts by weight of an acrylic copolymer having a weight average molecular weight of 100,000 g/mol (AOF7003, Aekyong Chemical) dissolved at 45 vol % in toluene/methyl ethyl ketone were used based on 100 parts by weight of the solid content of the anisotropic conductive film.

Comparative Example 1

Preparation of Anisotropic Conductive Film Including Urethane Resin Having a Tg of Less Than 100° C.

An anisotropic conductive film was prepared according to the same procedure as in Example 1, except that as a binder system, 40 parts by weight of a polyurethane acrylate having a weight average molecular weight of 30,000 g/mol and a Tg of 10° C.; 20 parts by weight of an acrylonitrile butadiene copolymer (1072CGX, Zeon Chemical) dissolved at 25 vol % in toluene/methyl ethyl ketone; and 20 parts by weight of an acrylic copolymer having a weight average molecular weight of 100,000 g/mol (AOF7003, Aekyong Chemical) dissolved at 45 vol % in toluene/methyl ethyl ketone were used based on 100 parts by weight of the solid content of the anisotropic conductive film. The polyurethane acrylate was synthesized from 60 wt % of polyol, 39 wt % of aliphatic isocyanate and 1 wt % of hydroxy(meth)acrylate using 50 vol % methyl ethyl ketone as a solvent. First, the polyol and the aliphatic isocyanate were reacted to synthesize a prepolymer having an aliphatic isocyanate terminal. Then, the prepolymer having the aliphatic isocyanate terminal and the hydroxy (meth) acrylate were reacted to prepare the polyurethane acrylate resin. The molar ratio of hydroxy (meth)acrylate to prepolymer having an aliphatic isocyanate terminal was 1.0, and polymerization of the polyurethane acrylate resin was carried out at a temperature of 90° C. and a pressure of 1 atm for 5 hours using dibutyltin dilaurate as a catalyst.

Comparative Example 2

Preparation of Anisotropic Conductive Film Including Styrene Resin

An anisotropic conductive film was prepared according to the same procedure as in Example 1, except that as a binder system, 40 parts by weight of an acrylonitrile-α-methylstyrene resin having a weight average molecular weight of 120,000 g/mol (AP-TJ, Cheil Industries) dissolved at 40 vol % in toluene/methyl ethyl ketone; 20 parts by weight of an acrylonitrile butadiene copolymer (1072CGX, Zeon Chemical) dissolved at 25 vol % in toluene/methyl ethyl ketone; and 20 parts by weight of an acrylic copolymer having a weight average molecular weight of 100,000 g/mol (AOF7003, Aekyong Chemical) dissolved at 45 vol % in toluene/methyl ethyl ketone were used based on 100 parts by weight of the solid content of the anisotropic conductive film.

The parts by weight of the components in the compositions in Examples 1 and 2, and Comparative Examples 1 and 2 are listed in Table 1.

TABLE 1

|  | Example 1 | Example 2 | Comparative Example 1 | Comparative Example 2 |
|---|---|---|---|---|
| Urethane resin having Tg of 100° C. or higher | 40 | 50 | — | — |
| Urethane resin having Tg of less than 100° C. | — | — | 40 | — |
| Thermoplastic resin | 20 | 15 | 20 | 20 |
| Acrylic copolymer | 20 | 15 | 20 | 20 |
| Styrene resin | — | — | — | 40 |
| Radical polymerizable compound | 15 | 15 | 15 | 15 |
| Organic peroxide | 2 | 2 | 2 | 2 |
| Conductive particles | 3 | 3 | 3 | 3 |
| Total | 100 | 100 | 100 | 100 |

Experimental Example 1

Measurement of Area of Bubbles

In order to measure the area of bubbles generated after final pressing, each of the anisotropic conductive films according to Examples 1 and 2, and Comparative Examples 1 and 2 was attached to a PCB (pitch: 200 µm, terminal: 100 µm, distance between terminals: 100 µm terminal height: 35 µm) and to a COF (pitch: 200 µm, terminal: 100 µm, distance between terminals: 100 µm, terminal height: 8 µm) under the following conditions:
 1) Preliminary pressing: 60° C., 1 second, 1.0 MPa
 2) Final pressing: 200° C., 5 seconds, 3.0 MPa After five specimens of each of the anisotropic conductive films according to Examples 1 and 2, and Comparative Examples 1 and 2 were attached as above, the specimens were evaluated as to the area of bubbles generated in spaces between the electrodes, as explained below.

The portions of the anisotropic conductive films in 10 of the spaces between the electrodes were photographed using an Olympus BX51, and the area in which bubbles were generated in each of these portions was measured based on the area of each of the 10 spaces between the electrodes (250 pitches in width, 3 mm in length).

Experimental Example 2

Measurement of Adhesive Strength

In order to measure the adhesive strength after final pressing, each of the anisotropic conductive films according to Examples 1 and 2, and Comparative Examples 1 and 2 was attached to a PCB (pitch: 200 µm, terminal: 100 µm, distance between terminals: 100 µm, terminal height: 35 µm) and to a COF (pitch: 200 µm, terminal: 100 µm, distance between terminals: 100 µm, terminal height: 8 µm) under the following conditions:
 1) Preliminary pressing: 60° C., 1 second, 1.0 MPa
 2) Final pressing: 150° C., 5 seconds, 3.0 MPa After five specimens of each of the anisotropic conductive films according to Examples 1 and 2, and Comparative Examples 1 and 2 were attached as above, the specimens were prepared and evaluated as to adhesive strength at 50 mm/min using a 90° peel strength tester (H5KT, Tinius Olsen).

Results of Experimental Examples 1 and 2, and Comparative Examples 1 and 2 are illustrated in Table 2.

TABLE 2

|  | Example 1 | Example 2 | Comparative Example 1 | Comparative Example 2 |
|---|---|---|---|---|
| Area of bubbles generated in space (%) | 5 | 4 | 40 | 7 |
| Adhesive strength (gf/cm) | 920 | 1020 | 960 | 520 |

The anisotropic conductive films including urethane resin having a Tg of about 100° C. or higher according to Examples 1 and 2 had a reduced area of bubbles generated after final pressing, which was about 4 or 5% of the area of the spaces between electrodes, and also exhibited an improved adhesive strength of about 900 to about 1,000 gf/cm or more. Thus, both suppression of bubble generation and adhesive strength may be improved when a urethane resin having a Tg of about 100° C. or higher is used.

On the other hand, the anisotropic conductive film including a urethane resin having a Tg of less than 100° C. according to Comparative Example 1 had an improved adhesive strength but had an increased area of bubbles after final pressing of 40%. Also, the anisotropic conductive film including styrene instead of urethane according to Comparative Example 2 had a reduced area of bubbles after final pressing, but exhibited a reduced adhesive strength of 520 gf/cm. Neither of Comparative Examples 1 and 2 were able to achieve both the improved suppression of bubble generation and improved adhesive strength of Examples 1 and 2.

By way of summary and review, anisotropic conductive films may refer to film-like adhesives in which conductive particles (e.g., metal particles or metal-coated polymer particles) are dispersed in a resin (e.g., an epoxy resin). Anisotropic conductive films may include a polymer layer having electric anisotropy and an adhesive property, and may exhibit conductive properties in the thickness direction of the films and insulating properties in the surface direction thereof. If an anisotropic conductive film is disposed between connection substrates (e.g., circuit boards) and is subjected to heating and pressing under particular conditions, terminals of the connection substrates may be electrically connected through conductive particles, and an insulating adhesive resin may fill in spaces between adjacent terminals to isolate the conductive particles from each other, thereby high insulation performance between the terminals may be provided.

If panels become larger and wirings are enlarged, spaces between electrodes may become wider. Because a connection substrate may expand due to pressing under heat and pressure in bonding, and may contract back after bonding, an adhesive composition may expand and contract to a substantial degree, which may cause bubbles to be generated and may cause a deterioration in filling effect of the adhesive composition.

Thus, it may be advantageous for an adhesive composition to be capable of withstanding expansion and contraction of a connection substrate due to heat and pressure. It may be particularly advantageous for an adhesive composition to have fewer bubbles generated in pressing, e.g., due to hardness of the adhesive composition. However, if a hard binder resin is used, the anisotropic conductive films may undergo reduction of adhesion causing process failure. That is, it may be difficult to achieve both suppression of bubble generation and excellent adhesion at the same time. However, as demonstrated above, the anisotropic conductive film of the embodiments may be able to generate fewer bubbles after pressing and exhibit excellent adhesion.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device bonded by an anisotropic conductive film, the anisotropic conductive film comprising:
   a binder system including a urethane resin having a glass transition temperature of about 100° C. or higher;
   a radical polymerizable compound;
   an organic peroxide; and
   conductive particles.

2. The semiconductor device as claimed in claim 1, wherein the urethane resin has a weight average molecular weight of about 50,000 to about 200,000 g/mol.

3. The semiconductor device as claimed in claim 1, wherein the urethane resin is a polyurethane acrylate resin.

4. The semiconductor device as claimed in claim 3, wherein the polyurethane acrylate resin is prepared by polymerization of:
   an isocyanate;
   an acrylate; and
   a polyol or a diol.

5. The semiconductor device as claimed in claim 1, wherein the urethane resin is present in an amount of about 35 to about 80 parts by weight, based on 100 parts by weight of the solid content of the anisotropic conductive film.

6. The semiconductor device as claimed in claim 1, wherein the anisotropic conductive film includes:
   about 50 to about 90 parts by weight of the binder system;
   about 5 to about 40 parts by weight of the radical polymerizable compound;
   about 0.1 to about 10 parts by weight of the organic peroxide; and
   about 0.1 to about 10 parts by weight of the conductive particles;
   all parts being based on 100 parts by weight of the solid content of the anisotropic conductive film.

7. The semiconductor device as claimed in claim 1, wherein the binder system further includes at least one of a thermoplastic resin and an acrylic copolymer.

8. A semiconductor device, comprising:
   a substrate including electrodes and a space between the electrodes, and
   an anisotropic conductive film on the substrate in the space between the electrodes, the anisotropic conductive film including a urethane resin having a glass transition temperature of about 100° C. or higher,
   wherein the anisotropic conductive film has:
      an average bubble area of 10% or less based on an area of the space between the electrodes; and
      an adhesive strength of about 800 gf/cm or more.

9. The semiconductor device as claimed in claim 8, wherein the urethane resin is a polyurethane acrylate resin.

10. The semiconductor device as claimed in claim 8, wherein the urethane resin is present in an amount of about 35 to about 80 parts by weight, based on 100 parts by weight of the solid content of the anisotropic conductive film.

11. The semiconductor device as claimed in claim 8, wherein the average bubble area and the adhesive strength of the anisotropic conductive film are measured after pressing the anisotropic conductive film into the space between the electrodes at a temperature of at least about 60° C., a pressure of at least about 1.0 MPa, and for a period of time of at least about 1 second.

12. The semiconductor device as claimed in claim 11, wherein the average bubble area and the adhesive strength of the anisotropic conductive film are measured after pressing the anisotropic conductive film into the space between the electrodes at a temperature of about 200° C., a pressure of about 3.0 MPa, and for a period of time of about 5 seconds.

13. An anisotropic conductive film for bonding a semiconductor device, the anisotropic conductive film comprising a urethane resin having a glass transition temperature of about 100° C. or higher,
   wherein the anisotropic film has:
      an average bubble area of 10% or less when the anisotropic conductive film is pressed in spaces between electrodes on a substrate at a temperature of 200° C., a pressure of 3.0 MPa, and for a period of time of 5 seconds, the average bubble area being an average area of bubbles based on an area of the spaces; and
      an adhesive strength of about 800 gf/cm or more when the anisotropic conductive film is pressed in spaces between electrodes on a substrate at a temperature of 150° C., a pressure of 3.0 MPa, and for a period of time of 5 seconds.

14. The anisotropic conductive film as claimed in claim 13, wherein the urethane resin is a polyurethane acrylate resin.

15. The anisotropic conductive film as claimed in claim 14, wherein the polyurethane acrylate resin is present in an amount of about 35 to about 80 parts by weight, based on 100 parts by weight of the solid content of the anisotropic conductive film.

* * * * *